(12) United States Patent
Clevenger et al.

(10) Patent No.: US 11,171,063 B2
(45) Date of Patent: Nov. 9, 2021

(54) METALIZATION REPAIR IN SEMICONDUCTOR WAFERS

(71) Applicant: International Business Machines Corporation, Armonk, NY (US)

(72) Inventors: Lawrence A. Clevenger, LaGrangeville, NY (US); Baozhen Li, South Burlington, VT (US); Kirk D. Peterson, Jericho, VT (US); John E. Sheets, II, Zumbrota, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/440,017

(22) Filed: Feb. 23, 2017

(65) Prior Publication Data

US 2018/0096902 A1 Apr. 5, 2018

Related U.S. Application Data

(62) Division of application No. 15/282,625, filed on Sep. 30, 2016, now abandoned.

(51) Int. Cl.
| | |
|---|---|
| H01L 21/768 | (2006.01) |
| H01L 21/306 | (2006.01) |
| H01L 21/324 | (2006.01) |
| H01L 23/532 | (2006.01) |
| H01L 21/66 | (2006.01) |

(52) U.S. Cl.
CPC ........ *H01L 22/12* (2013.01); *H01L 21/30625* (2013.01); *H01L 21/324* (2013.01); *H01L 21/7684* (2013.01); *H01L 21/76847* (2013.01); *H01L 21/76882* (2013.01);
(Continued)

(58) Field of Classification Search
CPC .... H01L 22/14; H01L 21/76847; H01L 22/20
See application file for complete search history.

(56) References Cited

U.S. PATENT DOCUMENTS 6,403,466 B1 * 6/2002 Lopatin ............... H01L 21/7684
257/E21.583
7,037,824 B2 5/2006 Burrell et al.
(Continued)

FOREIGN PATENT DOCUMENTS

WO 0245155 A2 6/2002

OTHER PUBLICATIONS

Filing Date Feb. 23, 2017, U.S. Appl. No. 15/440,017, Not Yet Published.
(Continued)

*Primary Examiner* — Omar F Mojaddedi
(74) *Attorney, Agent, or Firm* — Cantor Colburn LLP; L. Jeffrey Kelly

(57) ABSTRACT

Embodiments are directed to a method for repairing features of a host semiconductor wafer. The method includes forming a feature of the host semiconductor wafer, wherein the feature includes a first conductive material and a surface having a planar region and non-planar regions. The method further includes forming a metal conductive liner over the non-planar regions. The method further includes applying a second conductive material metal layer over said the conductive liner. The method further includes recessing the second conductive material to be substantially planar with the planar region.

7 Claims, 6 Drawing Sheets

(52) U.S. Cl.
CPC ........ *H01L 21/76898* (2013.01); *H01L 22/20* (2013.01); *H01L 23/53228* (2013.01); *H01L 23/53238* (2013.01)

(56) References Cited

U.S. PATENT DOCUMENTS

| | | | |
|---|---|---|---|
| 7,317,253 B2 | 1/2008 | Nogami | |
| 9,034,664 B2 | 5/2015 | Bonilla et al. | |
| 9,312,203 B2 | 4/2016 | Li et al. | |
| 2004/0035709 A1* | 2/2004 | Uzoh | H01L 21/76877 205/123 |
| 2004/0248407 A1* | 12/2004 | Liu | H01L 21/76879 438/642 |
| 2007/0267751 A1 | 11/2007 | Yang et al. | |
| 2009/0298280 A1* | 12/2009 | Yang | H01L 21/288 438/637 |
| 2010/0084766 A1 | 4/2010 | Yang et al. | |
| 2012/0007245 A1* | 1/2012 | Aklik | H01L 21/76877 257/764 |
| 2012/0190133 A1* | 7/2012 | Abou-Khalil | H01L 22/14 438/4 |
| 2014/0264232 A1* | 9/2014 | Lee | H01L 45/141 257/4 |
| 2015/0194385 A1* | 7/2015 | McFeely | H01L 23/53238 257/751 |
| 2015/0228548 A1* | 8/2015 | Adderly | H01L 21/485 438/4 |
| 2016/0276267 A1 | 9/2016 | Lee et al. | |

OTHER PUBLICATIONS

Filing Date Sep. 30, 2016, U.S. Appl. No. 15/282,625, Not Yet Published.
Clevenger et al., "Metalization Repair in Semiconductor Wafers," U.S. Appl. No. 15/282,625, filed Sep. 30, 2016.
Clevenger et al., "Metalization Repair in Semiconductor Wafers," U.S. Appl. No. 16/101,887, filed Aug. 13, 2018.
List of IBM Patents or Patent Applications Treated as Related; Date Filed: Feb. 23, 2017, 2 pages.
IBM, et al., "An Automated System for Thin Film Circuit Repair", Research Disclosure n316 08-90, 2 pages, IP.com Number: IPCOM000103241D, IP.com Electronic Publication: Mar. 17, 2005, IP.com.
Partridge, et al., "Repair of Circuits by Laser Seeding and Constriction Induced Plating", IEEE Transactions on Components, Hybrids, and Manufacturing Technology, vol. 15, No. 2, Apr. 1992, pp. 252-257, IEEE.
Stewart, "Copper Surface Chemistry Relevant to Chemical Mechanical Planarization (CMP)"; Publication Unknown; Final Seminar; Aug. 13, 2008, 3 pages.
Von Gutfeld, et al., "Copper microcircuit repair of opens using thermally driven exchange plating", Applied Physics Letters 56, Jun. 18, 1990, 4 Pages, AIP Publishing. DOI: 10.1063/1.102849.

\* cited by examiner

METALIZATION REPAIR IN SEMICONDUCTOR WAFERS

DOMESTIC PRIORITY

This application is a divisional of U.S. application Ser. No. 15/282,625, titled "METALIZATION REPAIR IN SEMICONDUCTOR WAFERS" filed Sep. 30, 2016, the contents of which are incorporated by reference herein in its entirety.

BACKGROUND

The present invention relates in general to integrated circuit (IC) fabrication methods and resulting structures. More specifically, the present invention relates to an improved process in the fabrication of ICs to detect and repair voids in metallization layers and vias.

In contemporary IC fabrication processes, semiconductor devices are coupled to one another by providing a network of interconnected metallization layers and conductive vias formed in the wafer/chip. Metallization layers and vias are often formed using copper (Cu), which facilitates the development of smaller metal components, reduced energy usage and higher-performance processors. In contemporary metallization/via fabrication techniques, voids can exist observable after the application of a chemical mechanical planarization (CMP) process. Voids in lines and/or vias, for example, create point defects disrupting electrical connections. The presence of voids reduces yield, performance and quality.

SUMMARY

Embodiments are directed to a method for repairing features of a host semiconductor wafer. The method includes forming a feature of the host semiconductor wafer, wherein the feature includes a first conductive material and a surface having a planar region and non-planar regions. The method further includes forming a metal conductive liner over the non-planar regions. The method further includes applying a second conductive material metal layer over said the conductive liner. The method further includes recessing the second conductive material to be substantially planar with the planar region.

Embodiments are further directed to a method for repairing features of a host semiconductor wafer. The method includes forming a feature of the host semiconductor wafer, wherein the feature includes a first conductive material and a surface having a planar region and non-planar regions. The method further includes determining a defect level of the feature, wherein the defect level corresponds to a characteristic of the non-planar regions. The method further includes comparing the defect level to a threshold. The method further includes applying a first repair methodology to the feature if the defect level is below the threshold. The method further includes applying a second repair methodology to the feature if the defect level is above the threshold.

Embodiments are further directed to a host semiconductor wafer. The feature includes a first conductive material. The feature further includes a surface of the first conductive material having a planar region and non-planar regions. The feature further includes a conductive liner over the non-planar regions. The feature further includes a second conductive material over the conductive liner.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
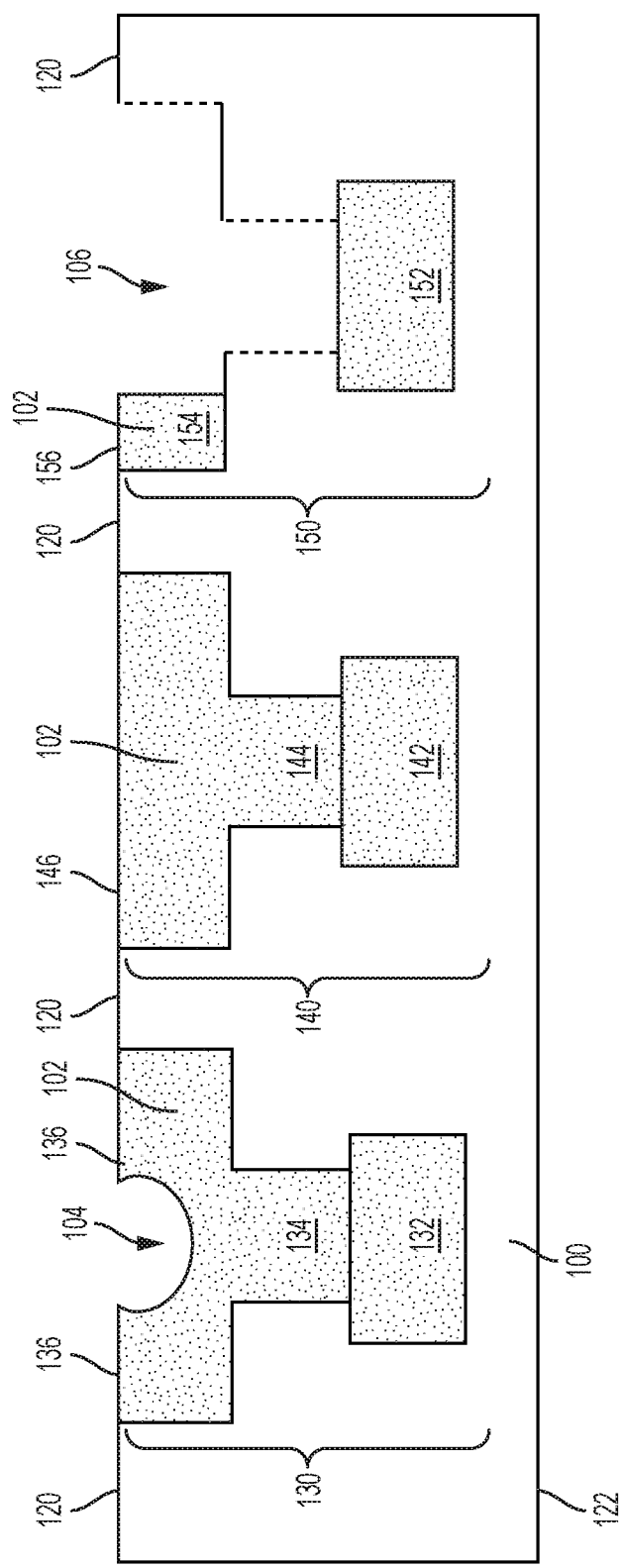
FIG. 1 depicts cross-sectional view of a host semiconductor wafer having metallization features with voids.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, which is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are relevant to aspects of the present invention, semiconductor devices are used in a variety of electronic applications. An integrated circuit (IC) is typically formed from various circuit configurations of semiconductor devices (e.g., transistors, capacitors, resistors, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

In contemporary semiconductor fabrication processes, a large number of semiconductor devices and conductive interconnect layers are fabricated in and on a single wafer. The conductive interconnect layers serve as a network of pathways that transport signals throughout an IC, thereby connecting circuit components of the IC into a functioning whole and to the outside world. Conductive interconnect layers vary in number and type depending on the complexity of the device. Interconnect layers are themselves interconnected by a network of holes (or vias) formed through the IC. For example, a through-silicon via (TSV) is an electrical contact that passes completely through the semiconductor wafer or die. In multilevel IC configurations, for example, a TSV can be used to form vertical interconnections between a semiconductor device located on one level of the IC and an interconnect layer located on another level of the IC. As IC feature sizes continue to decrease, the aspect ratio, (i.e., the ratio of height/depth to width) of features such as vias generally increases. Fabricating intricate structures of conductive interconnect layers and vias within an increasingly smaller IC footprint is one of the most process-intensive and cost-sensitive portions of semiconductor IC fabrication.

In its simplest configuration, a via or TSV is formed by creating a hole or opening through the semiconductor wafer at a desired location, and then filling the via with conductive material, thereby providing a solid metal contact that extends from a front side of the wafer to a back side of the wafer. There are several considerations in forming vias. For example, in order to be compatible with downstream processing techniques, the conductive metal fill of the via must be substantially planar with the front side of the wafer and the back side of the wafer.

Metallization layers and vias are often formed from copper, which facilitates the development of smaller metal components, reduced energy usage and higher-performance processors. The fabrication of copper metallization layers and vias can include forming structures such as shallow trenches, plugs, vias, or interconnects etched into a silicon wafer, and then filling the structure with copper, such as through an electroplating process. Because there are many layers in semiconductor devices, each layer must be planar so that non-uniformities do not propagate throughout the layering process. Chemical mechanical planarization (CMP) removes the copper overburden produced by the electroplating process. The CMP slurry used in the CMP process can include chelating agents, oxidizers, corrosion inhibitors, buffers, surfactants, and abrasives. Despite the application of CMP, voids in the conductive material can exist, reducing yield, performance and quality. Thus, a method is desired to repair such voids to improve the semiconductor structure.

Turning now to an overview of aspects of the present invention, one or more embodiments described herein provide methods of fabricating a host semiconductor wafer having improved metallization features. The method can include the deposition of a liner over voids in the metallization feature. The method further includes providing an additional layer of copper over the liner. The method further includes the deposition of an additional layer of copper over the liner to fill the voids, followed by a CMP applied to the additional layer of copper to bring the additional layer of copper planar with the major (or front) surface of the wafer.

In some embodiments of the present invention, the method can include performing an inspection of the metallization features for voids, determining whether the voids exceed a certain level, and then selecting a repair method that best matches the level of voids present. According to one or more embodiments of the present invention, the method can include the application of a current to a metallization feature having voids.

Turning now to a more detailed description of embodiments of the present invention, FIG. 1 depicts a cross-sectional view of a host semiconductor wafer or chip 100 having a substantially planar front face 120 and a substantially planar back face 122. Although one host wafer 100 is depicted in FIG. 1, the teachings of the present invention can be applied to ICs having multiple wafers. Formed within host wafer 100 is a conductive network, which is represented diagrammatically in FIG. 1 by conductive structures 130, 140, 150, which transmit data and other signals to and from semiconductor devices (not shown) and other components formed in and on the host wafer 100. In practice, the conductive network and conductive structures 130, 140, 150 can take any form, and the number and configurations of the conductive structures 130, 140, 150 depicted in FIG. 1 are provided as simplified examples for ease of illustration, and do not limit the types of conductive structures to which the repair techniques of the present invention can be applied.

The basic components of contemporary conductive networks are metallization lines/layers and conductive vias. Accordingly, the diagrams of conductive structures 130, 140, 150 include lower portions representing metallization layers/lines 132, 142, 152 and upper portions representing vias 134, 144, 154.

Conductive structures 130, 140, 150, including metallization lines 132, 142, 152 and vias 134, 144, 154, are formed using standard semiconductor IC fabrication techniques, which are known generally as metallization processes, to form a network of pathways (e.g., trenches, plugs, vias, and the like) in the host wafer 100. The metallization lines 132, 142, 152 and vias 134, 144, 154 are formed from electrically conductive material 102. In one or more embodiments, the electrically conductive material is a metal. In one or more embodiments, the metal is copper. The exposed contacts surfaces 136, 146, 156 of the conductive structures 130, 140, 150 provide contact points for making electrical contact to the conductive structures 130, 140, 150, and particularly to vias 134, 144, 154. In order to be compatible with downstream processing techniques, it is necessary in contemporary IC designs that the contact surfaces 136, 146, 156 are substantially uniform and substantially planar with the front face 120 of the host wafer 100. However, even after the application of recess and planarization processes (e.g., CMP) that are intended to make the contact surfaces 136, 146, 156 substantially planar with the front face 120 of the host wafer 100, non-uniform or non-planar regions (referred to herein as "voids") can be present on and in the con surfaces 136, 146, 156.

As shown in FIG. 1, conductive structure 140 depicts an example wherein contact surface 146 is substantially planar with the front face 120 of the host wafer 100, and substantially free from non-uniform or non-planar regions (referred to herein as "voids") on and in the contact surface 146. By contrast, conductive structures 130, 150, depict examples of non-uniform or non-planar regions on and in contact surfaces 136, 156 in the form of voids 104, 106 that are present in the electrically conductive material 102 of conductive structures 130, 150 subsequent to a final recess and planarization operation performed as part of a contemporary metallization process. In conductive structure 150, the dotted lines represent defective liners that were part of the original fabrication process of conductive structures 130, 140, 150, and that contributed to the formation of void 106. Voids 104, 106 can disrupt electrical connections, reducing yield, performance and quality.

Figure 2A:
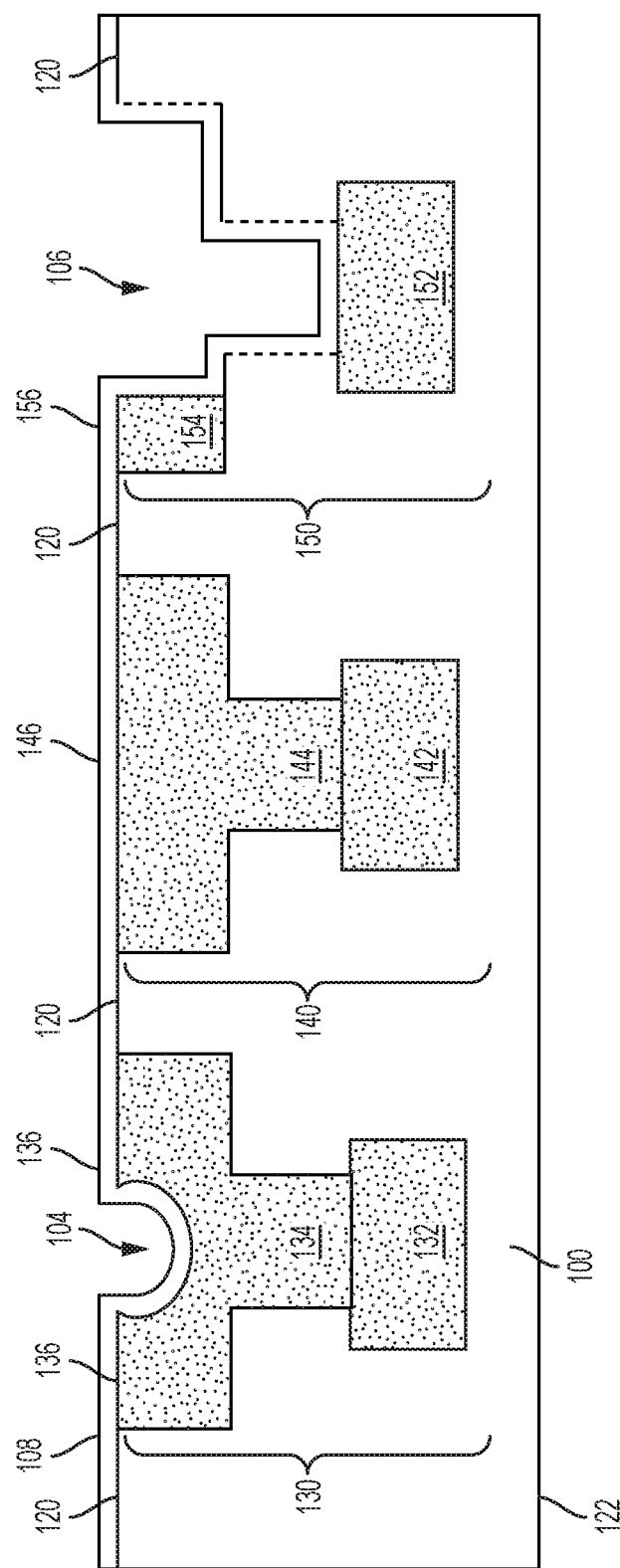
FIG. 2A depicts a cross-sectional view of the host semiconductor wafer before an operation of a metallization repair methodology according to one or more embodiments of the present invention.
Figure 2B:
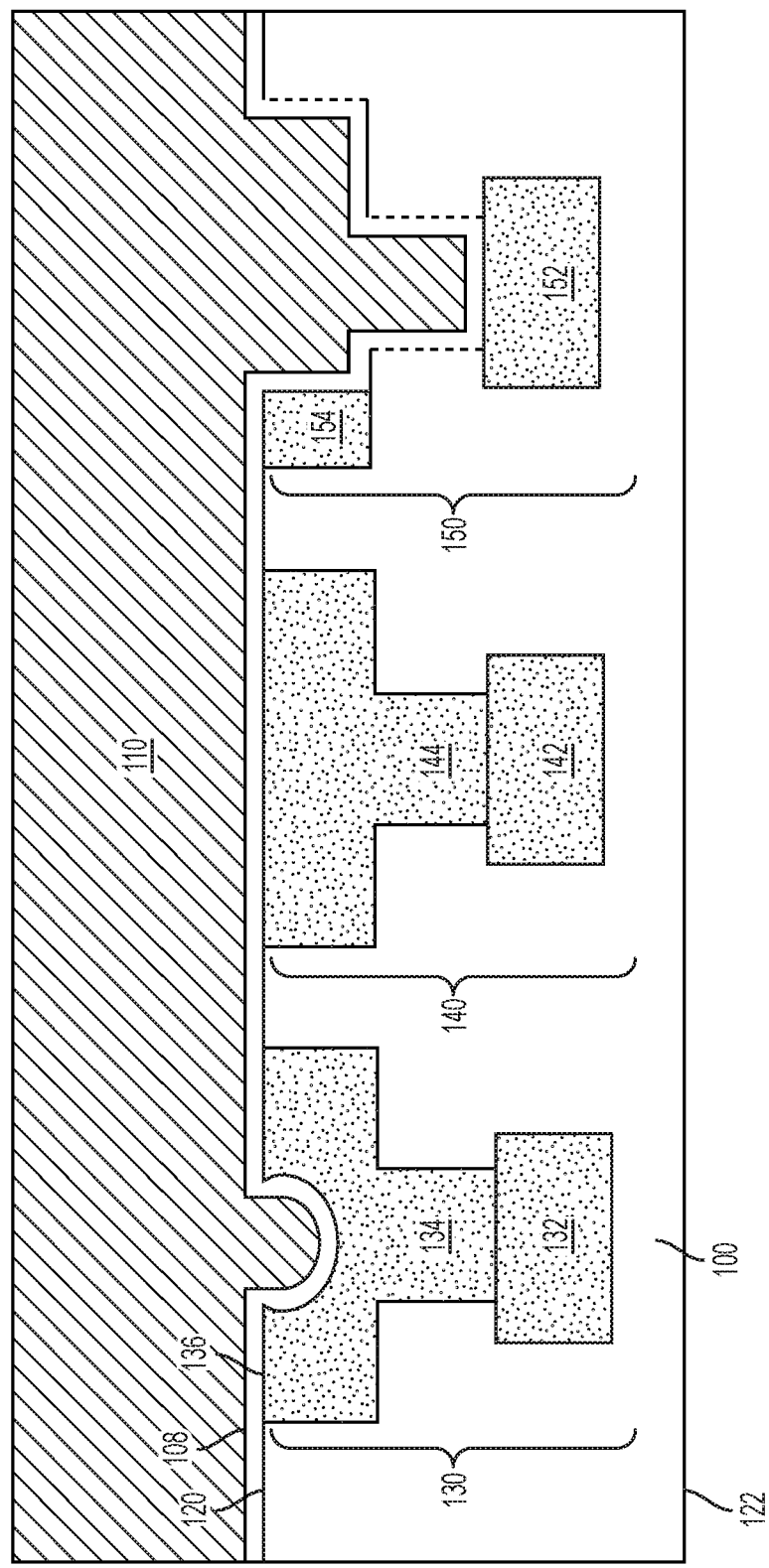
FIG. 2B depicts a cross-sectional view of the host semiconductor wafer after an operation of a metallization repair methodology according to one or more embodiments of the present invention.
Figure 2C:
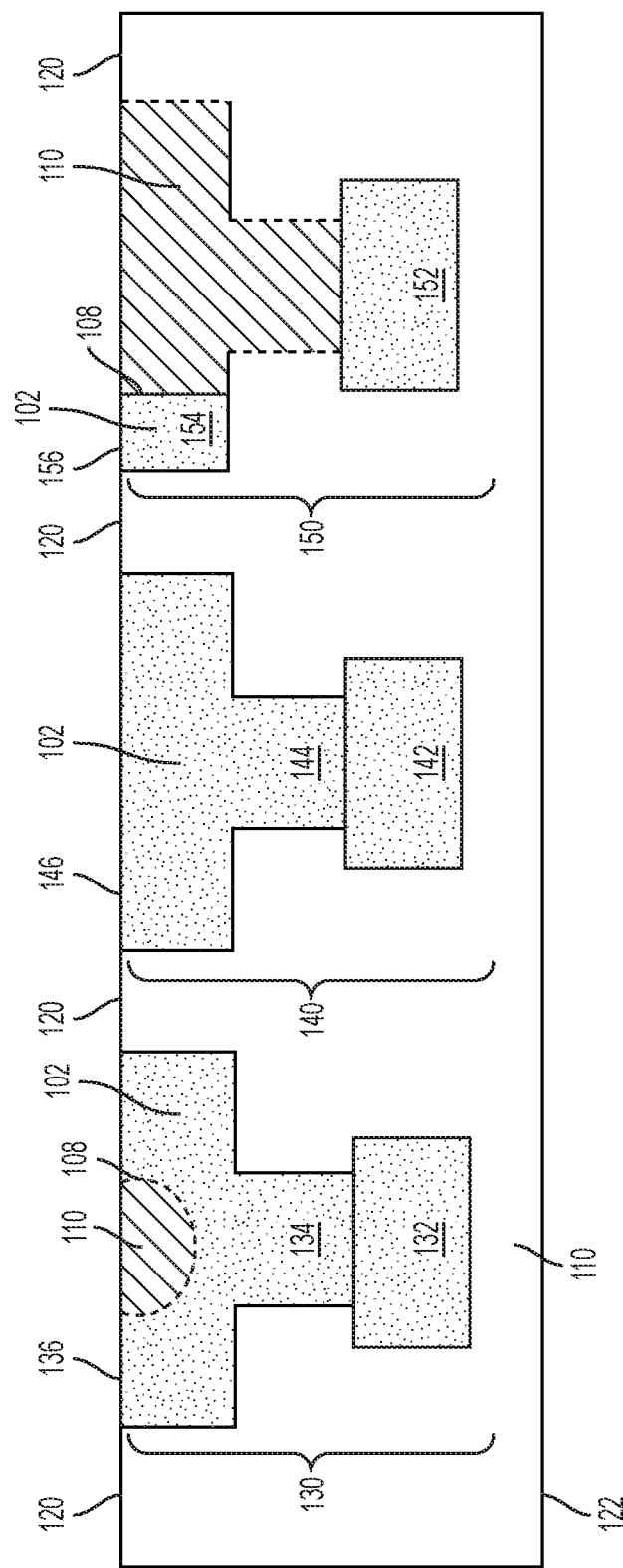
FIG. 2C depicts a cross-sectional view of the host semiconductor wafer after an operation of a metallization repair methodology according to one or more embodiments of the present invention.

FIGS. 2A, 2B and 2C depict the host wafer 100 after various stages of a metallization repair process according to embodiments of the present invention. As shown in FIG. 2A, a liner 108 is conformally applied over the front face 120 of host wafer 100, including specifically over the voids 104, 106. In embodiments, the liner 108 is a metal, including, for example, tantalum, cobalt, ruthenium, and/or their nitrides as some non-limiting examples. Such materials when used for liner 108 provide good adhesion to the dielectric and the copper below liner 108, and also provide good media for copper seed layer deposition and plating to form additional conductive layer 110 (shown in FIG. 2B). The liner 108 can be formed to a thickness of about 3 nm to 10 nm, although other dimensions are contemplated by the present invention. Liner 108 can be deposited using any now known or later developed technique, including but not limited to, for example, chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE) plating, or evaporation.

As shown in FIG. 2B, after liner 108 is applied conformally over the front face 120 of the host wafer 100, including specifically over the voids 104, 106, an additional conductive layer 110 is applied over liner 108. In one or more embodiments, conductive layer 110 is a metal. In one more embodiments, the metal is copper. In one more embodiments, conductive layer 110 is formed to a thickness dimension that is within a range from about 10 nm to about 300 nm, although other dimensions are contemplated by the present invention. In embodiments, the conductive layer 110 is formed by any conventional deposition method.

A reflow process is applied to conductive layer 110. In an exemplary reflow process, host wafer 100 is subjected to controlled heat, which enables the attachment of conductive layer 110 through the liner 108 to the conductive layer 110, and improving the electronic coupling between and among conductive layer 110, liner 108 and conductive material 102. In one or more embodiments, after reflow of the conductive layer 110, the liner 108 provides a permanent attachment of the liner 102 to both the conductive material 102 and the conductive layer 10. In the reflow process, after depositing (e.g., by PVD) the conductive layer of 110 on the liner 108, the conductive layer 110 is heated to make the conductive material of the conductive layer 110 (e.g., copper) reflow to fill the voids (e.g., 104, 106). In the reflow process, the temperature used (e.g., about 100 degrees Celsius) is much lower than the melting point of the conductive material of the conductive layer 110 (usually 200-300 degrees Celsius). The surface tension and capillary drive the conductive material of the conductive layer 110 to move. Heating can be accomplished by passing host wafer 100 through a reflow oven or under an infrared lamp. The temperature of the reflow process is selected such that the conductive material of the conductive layer 110 reflows without overheating and damaging surrounding electrical components (now shown). An exemplary reflow process includes four stages or zones, namely preheat, thermal soak, reflow and cooling, wherein each stage has a distinct thermal profile. After the reflow process is complete, conductive layer 110 is physically attached and electronically coupled through the liner 108 to the conductive material 102. The reflow process also causes the conductive layer 110 to fill voids 104, 106. In one or more embodiments, the reflow anneal is performed at approximately 250° C. In one or more embodiments, the conductive layer 110 is copper, and the reflow anneal reflows copper to completely fill voids 104, 106.

As shown in FIG. 2C, a recess and planarization process is applied to the conductive layer 110 to bring the conductive layer 110 to being substantially planar with the front face 120 of the host wafer 100. In one or more embodiments, the recess and planarization process is a CMP process that removes any overburden from the conductive layer 110. The CMP slurry can include a number of components, including chelating agents, oxidizers, corrosion inhibitors, buffers, surfactants, and abrasives. The resulting conductive structures 130, 150 now include conductive layer 110 physically attached and electronically coupled to liner 108, which is physically attached and electronically coupled to conductive material 102.

Figure 3:
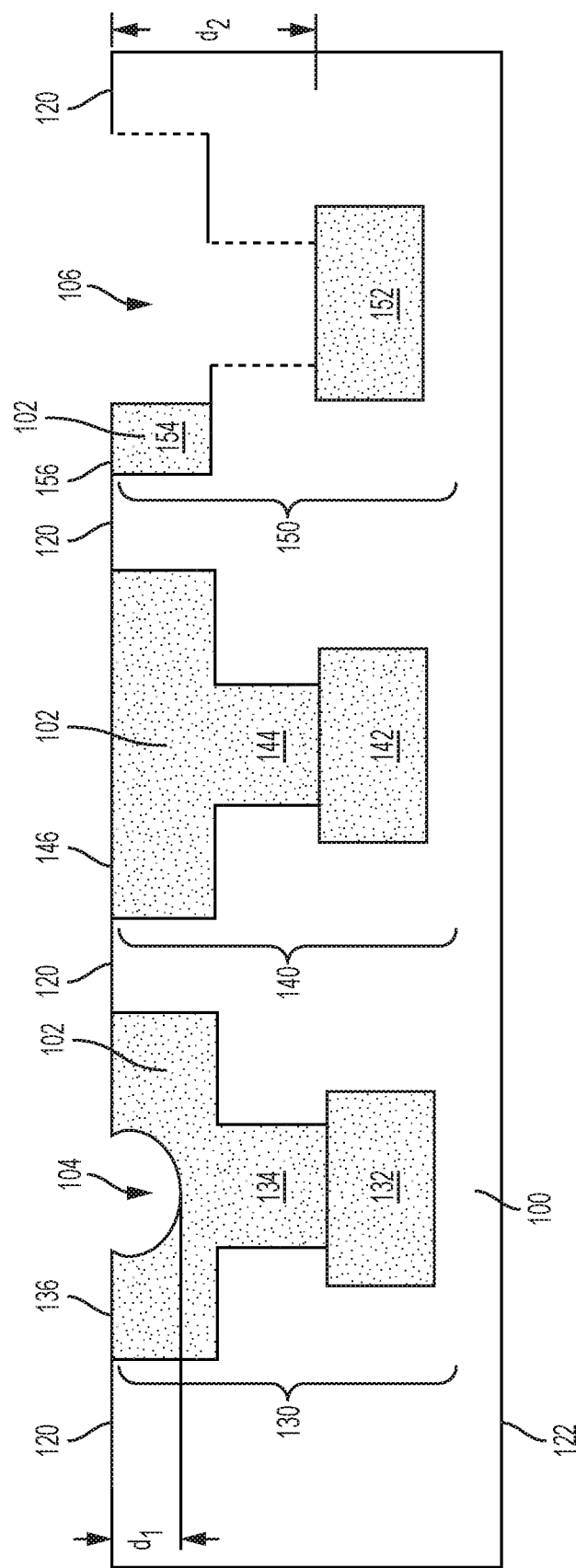
FIG. 3 depicts a cross-sectional view of a host semiconductor wafer having metallization features with voids.
Figure 4:
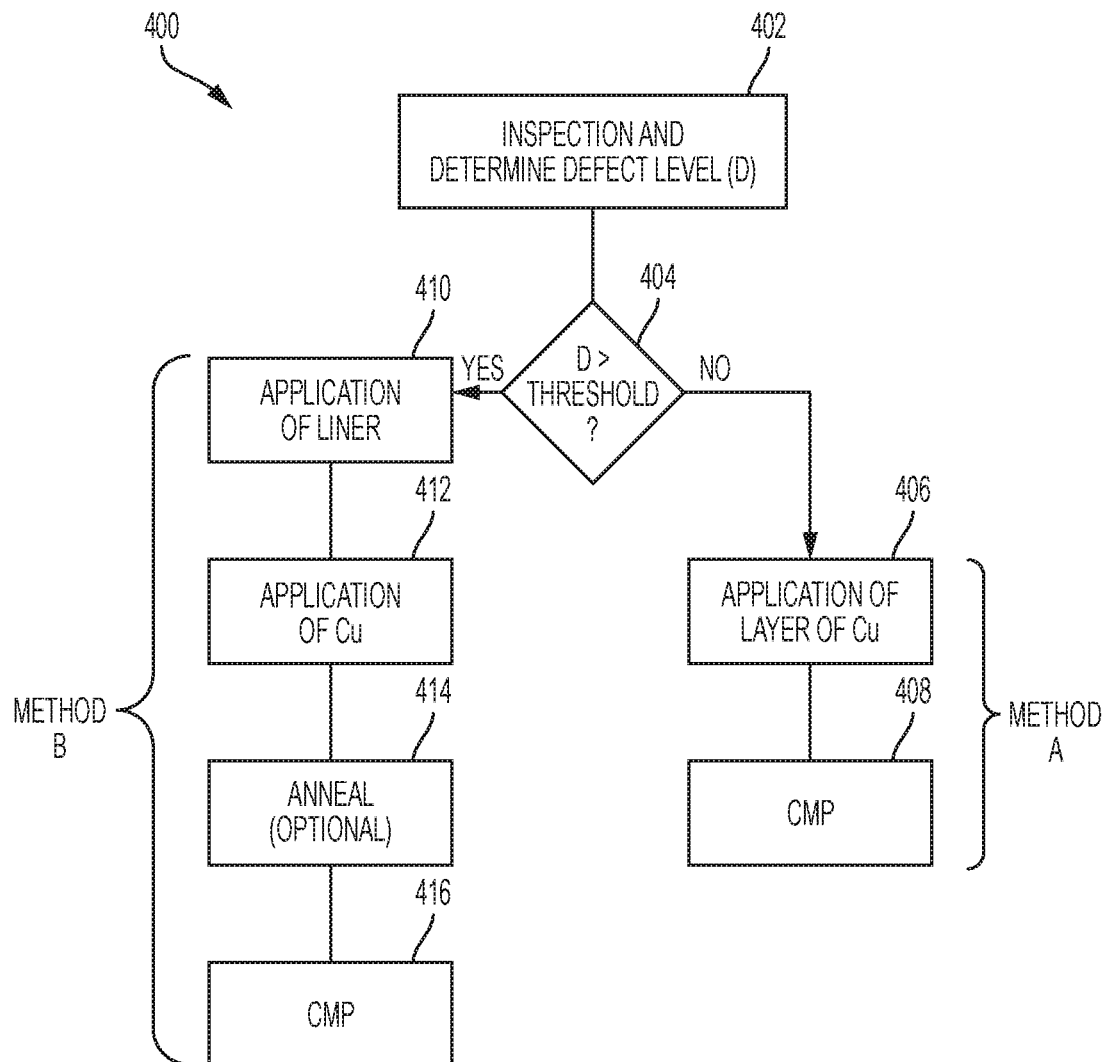
FIG. 4 depicts a flow diagram illustrating a methodology according to one or more embodiments of the present invention.

FIGS. 3-4 depict aspects of a method 400 (shown in FIG. 4) of repairing of voids 104, 106 in accordance with one or more embodiments of the present invention. As shown in FIG. 4, method 400 begins at block 402 by performing an inspection of the conductive structures 130, 140, 150. FIG. 3 depicts one example of how the inspection 402 can be performed. As shown in FIG. 3, voids 104, 106 can be inspected and/or measured to determine their extent by measuring certain dimensions of the voids 104, 106, examples of which are shown at $d_1$ and $d_2$. In one or more embodiments, a defect level (D) can be determined by adding $d_1$ and $d_2$. In one or more embodiments, the defect level D can be based on both measurements and estimates. Suitable inline defect detection methods include PLY (Process/photo limited yield) or AFM (atomic force macroscopy). PLY can include optical (i.e., bright field and dark field) and E-beam measurements. PLY can be used to identify the size of a void (e.g., 104, 106), while AFM can be used to identify the depth of a void (e.g., 104, 106).

Returning now to FIG. 4, the method 400 moves to decision block 404 to determine whether the defect level D is above a predetermined threshold. According to embodiments of the present invention, the repair method that is applied is selected based at least in part on the defect level D. For example, it can be determined that, for certain IC functions, and for a defect level D below a predetermined level, a particular repair method A is most appropriate. Similarly, it can be determined that, for the same IC functions, and for a defect level D above a predetermined level, a particular repair method B is most appropriate. Additional threshold levels/ranges and appropriates repair methods can also be devised. For ease of illustration and explanation, only one threshold level and two repair options are depicted in method 400.

If the answer to the inquiry at decision block 404 is no, method 400 proceeds to implement a repair method A, which includes block 406 and block 408. In block 406 a layer of conductive material (e.g., copper) is applied over the voids, and in block 408 the layer of conductive material is recessed and polished back (e.g., using CMP). Blocks 406 and 408 are provided as one example of a suitable repair method A, and other examples of repair method A can be used as long as it is determined that the repair method provides an appropriate level of repair for defect levels D below the threshold.

If the answer to the inquiry at decision block 404 is yes, method 400 proceeds to implement a repair method B, which includes blocks 410, 412, 414 (optionally) and 416. Blocks 410, 412, 414, and 416 implement the repair method illustrated in FIGS. 1, 2A, 2B, and 2C and described previously herein. In block 410, a liner is applied over the voids. In block 412, a layer of conductive material (e.g., copper) is applied over the liner, and in block 414 an anneal is optionally applied. In block 416, the layer of conductive material is recessed and polished back (e.g., using CMP). Blocks 410, 412, 414 and 416 are provided as one example of a suitable repair method B, and other examples of repair method BA can be used as long as it is determined that the repair method provides an appropriate level of repair for defect levels D above the threshold.

Another method of repairing of voids 104, 106 utilizes a current source for supplying current to and through conductive structures 130, 140, 150. During the original formation of conductive structures 130, 140, 150, an original conductive material is deposited over the front face 120 of the host wafer 100. A CMP is applied to polish back the original material toward the front face 120. The CMP is stopped just before reaching the front face when a thin film of the original conductive material is still present across the front face 120 and the conductive structures 130, 140, 150 have formed. An inspection of the type described in connection with block 402 of methodology 400 (shown in FIG. 4) is performed, and if repair is needed (i.e., D is above a threshold, or within a range), a direct conductive material plating is performed using the current source and thin conductive layer. Another defect inspection (e.g., block 402 shown in FIG. 4) is performed, and if more repair is needed (i.e., D is above a threshold, or within a range), an appropriate repair method is applied, which can be methods A or B, or the above-described plating repair method, based on the extent of the defects D. The process can be iterated until a suitable defect level is achieved. In one more embodiments, the original conductive material is a metal. In one or more embodiments, the original conductive material is copper. In one or more embodiments, the duration and value of the current supplied by the current source is controlled by a processor-based controller (not shown).

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The corresponding structures, materials, acts, and equivalents of all means or step plus function elements in the claims below are intended to include any structure, material, or act for performing the function in combination with other claimed elements as specifically claimed. The present invention has been presented for purposes of illustration and description, but is not intended to be exhaustive or limited to the form described. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections therebetween. All of these variations are considered a part of the invention.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present invention has been described in detail in connection with only a limited number of embodiments, it should be readily understood that the present invention is not limited to such described embodiments. Rather, the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A method for repairing features of a host semiconductor wafer, the method comprising:
   forming a feature of the host semiconductor wafer, wherein forming the feature comprises forming a first conductive material having an exposed surface, wherein forming the feature further comprises applying one or more planarization operations to the exposed surface of the first conductive material to recess and planarize the exposed surface of the first conductive material without leaving non-planar regions in a post-planarization exposed surface of the first conductive material, wherein applying the one or more planarization operations is unsuccessful at planarizing the exposed surface of the first conductive material without leaving non-planar regions because, subsequent to applying the one or more planarization operations, the post-planarization exposed surface formed by the one or more planarization operations comprises a planar region and unwanted post-planarization defects comprising unwanted post-planarization non-planar regions;
   making a determination of a defect level of the feature, wherein the defect level corresponds to a characteristic of the unwanted post-planarization non-planar regions;
   based at least in part on a first result the determination of the defect level of the feature, applying a first repair methodology to the feature; and
   based at least in part on a second result of the determination of the defect level of the feature, applying a second repair methodology to the feature
   wherein the first repair methodology is different from the second repair methodology.

2. The method of claim 1, wherein the first repair methodology comprises:
   applying a second conductive material over at least the unwanted post-planarization non-planar regions; and
   recessing the second conductive material to be substantially planar with the planar region of the post-planarization exposed surface.

3. The method of claim 2, wherein the first conductive material comprises copper, and the second conductive material comprises copper.

4. The method of claim 1, wherein the second repair methodology comprises:

forming a conductive liner over at least the unwanted post-planarization non-planar regions, wherein the conductive liner is configured to provide adhesion to the first conductive material;

forming a layer of a second conductive material over the conductive liner;

recessing the layer of the second conductive material to be substantially planar with the planar region of the post-planarization exposed surface; and applying a reflow process to the second conductive material by heating the second conductive material to a temperature level that is sufficient to reflow the second conductive material but below a temperature level that would damage electrical components that surround the feature.

5. The method of claim 4, wherein the conductive liner comprises a thickness dimension within a range of about 3 nm to about 10 nm.

6. The method of claim 4, wherein:

recessing the second conductive material comprises applying a chemical mechanical planarization (CMP) to the second conductive material; and applying the reflow process to the second conductive material comprises heating the second conductive material to a temperature level of about 100 degrees Celsius, which is sufficient to reflow the second conductive material but below the temperature level that would damage the electrical components that surround the feature.

7. The method of claim 1, wherein the second repair methodology comprises applying a current to the first conductive material to induce a plating of the first conductive material.

* * * * *